United States Patent

Matsumoto et al.

[11] Patent Number: 6,150,606
[45] Date of Patent: *Nov. 21, 2000

[54] ELECTROMAGNETIC SHIELD

[75] Inventors: Hiroshi Matsumoto; Yasuo Yoshiura; Tatsumi Kondo, all of Tokyo, Japan

[73] Assignee: SMK Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/088,708

[22] Filed: Jun. 2, 1998

[30] Foreign Application Priority Data

Jun. 4, 1997 [JP] Japan ................................. 9-160640

[51] Int. Cl.⁷ .................................................. H05K 9/00
[52] U.S. Cl. .................................. 174/35 R; 174/35 GC; 361/816; 361/818; 361/748; 439/108; 439/76.1
[58] Field of Search ............................ 174/35 R, 35 GC; 361/816, 818, 748; 439/108, 76.1

[56] References Cited

U.S. PATENT DOCUMENTS 5,313,016  5/1994  Brussati et al. ..................... 174/35 GC Primary Examiner—William A. Cuchlinski, Jr.
Assistant Examiner—Ronnie Mancho
Attorney, Agent, or Firm—Armstrong, Westerman, Hattori, McLeland & Naughton

[57] ABSTRACT

Contact piece (63), which are used to establish therethrough electric connections between shielding areas on front and rear cases (41) and (43) making up an electronic equipment housing, are formed without bending so that they can be mounted on ribs (57, 59) of the cases (41, 43). A metal shield layer is coated all over the interior surface (55) of the rear case (43) and the partition wall (59) in a manner to surround a high-frequency oscillation circuit, and each contact piece (63) is held in a recess (61) formed in the partition wall (59). The contact pieces (63) are each produced by stamping a conductive sheet metal and has a resilient contact portion (75), which makes resilient contact with the shielding area (53) on the mating case by bending in direction perpendicular to that in which the contact piece (63) was stamped from the conductive sheet metal. The contact piece (63) can be formed simply by stamping and can be mounted in the recess (61) of about the same width as its thickness. Hence, the contact piece (63) can be mounted in the rib (57, 59) of a small thickness.

2 Claims, 6 Drawing Sheets

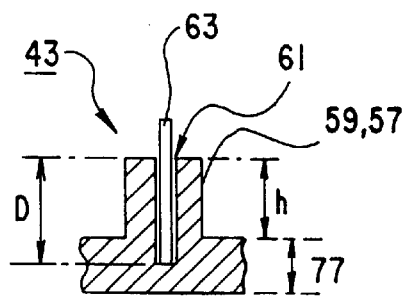
Fig.7
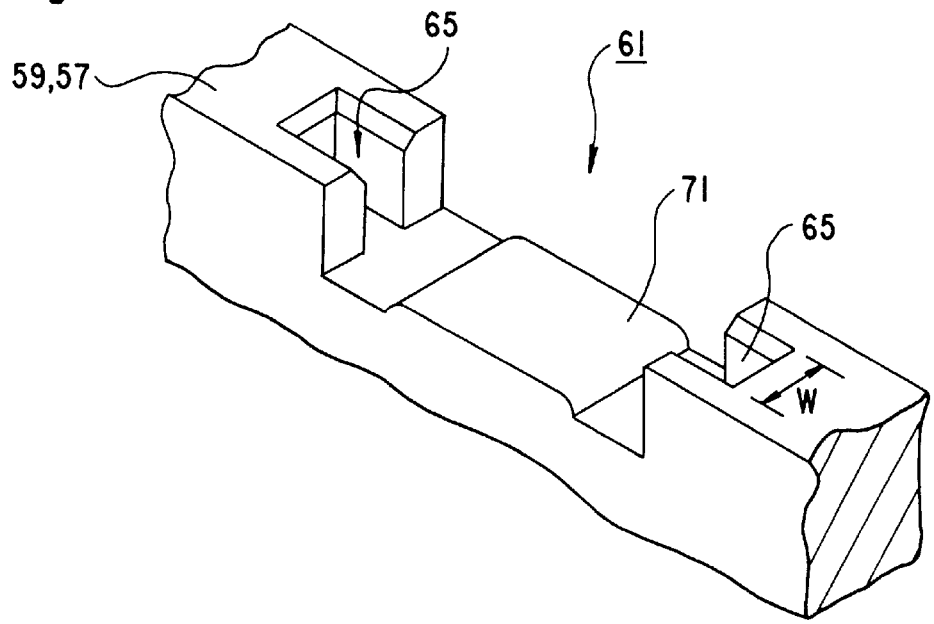
Fig.8
Fig.9
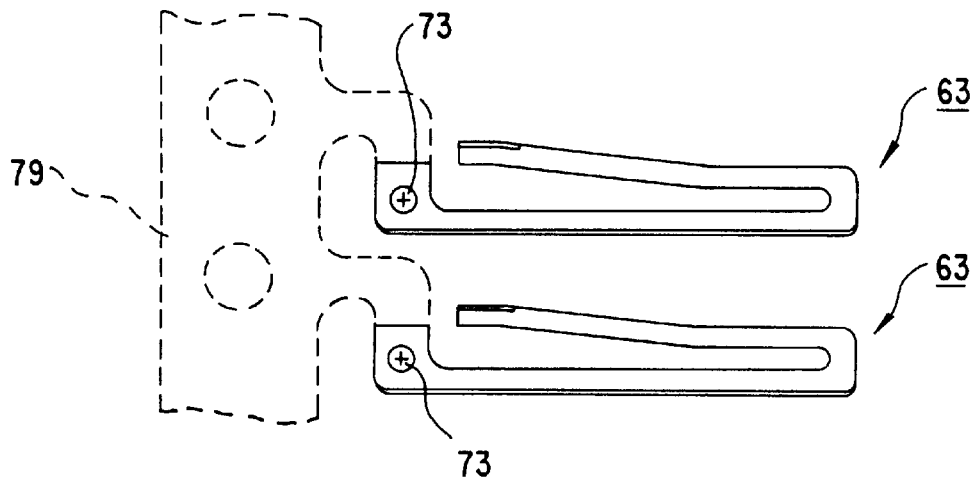

(a)

(b)

ELECTROMAGNETIC SHIELD

BACKGROUND OF THE INVENTION

1. Field of the Invention

The present invention relates to an electromagnetic shield for preventing leakage of electromagnetism to the outside from a high-frequency oscillation circuit placed in electronic equipment such as a portable telephone. More particularly, the invention pertains to an electromagnetic shield structure that establishes electric connections between electromagnetically shielding areas on front and rear cases of an electronic equipment housing.

2. Description of the Prior Art

In FIGS. 12 through 14 there is depicted a prior art example (Japanese Patent Application Laid-Open No. 46396/97), in which the housing of a portable telephone is made up of a rear case (a main body) 1 and a front case (a cover) 3. In the rear case 1 there is disposed a printed-circuit board 6, on which a high-frequency oscillation circuit 7 and other electronic parts are mounted.

The interior surfaces 9 of the front and rear cases 3 and 1 and the surfaces of partition walls 11 formed integrally with the rear case 1, surrounding the high-frequency oscillation circuit 7, are each coated with a metal shield layer (not shown), for example, by nickel plating or copper evaporation.

On each partition wall 11 coated with the metal shield layer, there is mounted a metal contact piece 13 in straddle fashion as shown in FIG. 13. The contact piece 13 has an inverted U-shaped cross-section in its entirety and has a gripping portion 15, which grippingly engages the top of the partition wall 11 and hence is electrically connected to the metal shield layer coated all over it, Reference numeral 17 denotes resilient contact portions cut and raised obliquely upward from the contact piece 13.

On the printed-circuit board 5 disposed in the rear case 1 there are printed at places opposite the contact portions 17 grounding patterns 19 serving as shielding areas. When the front and rear cases 3 and 1 are assembled into the telephone housing, the contact portions 17 are pressed into resilient contact with the grounding patterns 19. This resilient contact establishes electrical connections between the metal shield layer of the front case 1 and the shielding areas of the rear case 3, i.e. the grounding patterns 19 on the printed-circuit board 5, provide an electromagnetic shielding around the high-frequency oscillation circuit 7.

In FIG. 16 there is depicted another prior art example, in which a contact piece 21 has a flat, U-shaped cross-section and its opposed tip end portions form resilient contact portions 23. The contact piece 21 is soldered to a grounding pattern 29 on a printed-circuit board 27 placed in a rear case 25. The contact portions 23 make resilient contact with a partition wall 33 of a front case 31. In this instance, the contact portions 23 contact the ceiling 37 of a recess 36 made in the partition wall 33.

The contact pieces 13 and 21 of the both prior art examples are each obtained by punching a sheet of phosphor bronze into a blank of a predetermined shape and bending it at right angles or obliquely to its surface. These contact pieces 13 and 21 are both so small that their bending inevitably involves precision machining, resulting in an increase in the manufacturing costs of electronic equipment.

Further, the gripping engagement of the gripping portion 16 of each contact piece 13 with the top of the partition wall 11 requires the formation of the wall 11 to a height large enough to provide for the height H of the gripping portion 15 as shown in FIG. 14. This makes it difficult to reduce the thickness of the entire housing structure by decreasing the height of the partition wall 11.

In the prior art example of FIG. 16, soldering of the contact piece 21 to the grounding pattern 29 requires that the latter to be formed over a wide area—this inevitably lowers the packaging density of other electronic parts over the entire area of the printed-circuit board 27.

SUMMARY OF THE INVENTION

It is therefore an object of the present invention to provide an electromagnetic shield structure that can be realized without involving bending of contact pieces and without lowering the packaging density of electronic parts over the entire area of the printed-circuit board.

To attain the above objective, according to an aspect of the present invention, there is provided an electromagnetic shield structure for electronic equipment having a high-frequency oscillation circuit placed in its housing made up of front and rear cases with shielding areas provided on their inside surfaces in a manner to surround the high-frequency oscillation circuit, the shielding areas being electrically connected by resilient contact means to provide electromagnetic shielding for preventing leakage of electromagnetism to the outside from the high-frequency circuit. The magnetic shield structure comprises: ribs forming peripheral side walls or partition walls of the front or rear case, each of the ribs having a contact receiving recess extending down from the top thereof; metal shield layers coated all over the interior surfaces of the contact receiving recess and said front or rear case to establish electric connections between them; and a contact piece stamped from a conductive sheet metal, the contact piece having an engaging portion and a contact portion formed integrally therewith. The engaging portion is press-fitted in the contact receiving recess formed in each rib. The contact portion is formed and held in the same plane as that of the engaging portion and is resilient in a direction perpendicular to that in which the contact piece was stamped from the conductive sheet metal. Further, the contact portion makes resilient contact with the shielding area of the rear or front case.

According to another aspect of the present invention, the shielding area, with which the contact portion of the contact piece makes resilient contact, is a grounding pattern printed on a printed-circuit board placed in the rear or front case.

BRIEF DESCRIPTION OF THE DRAWINGS

FIG. 7 is a diagram explanatory of a contact receiving recess 61;

FIG. 8 is a perspective view of the contact receiving recess 61;

FIG. 9 is a diagram showing contact pieces 63 connected to a carrier;

DESCRIPTION OF THE PREFERRED EMBODIMENTS

Figure 1:
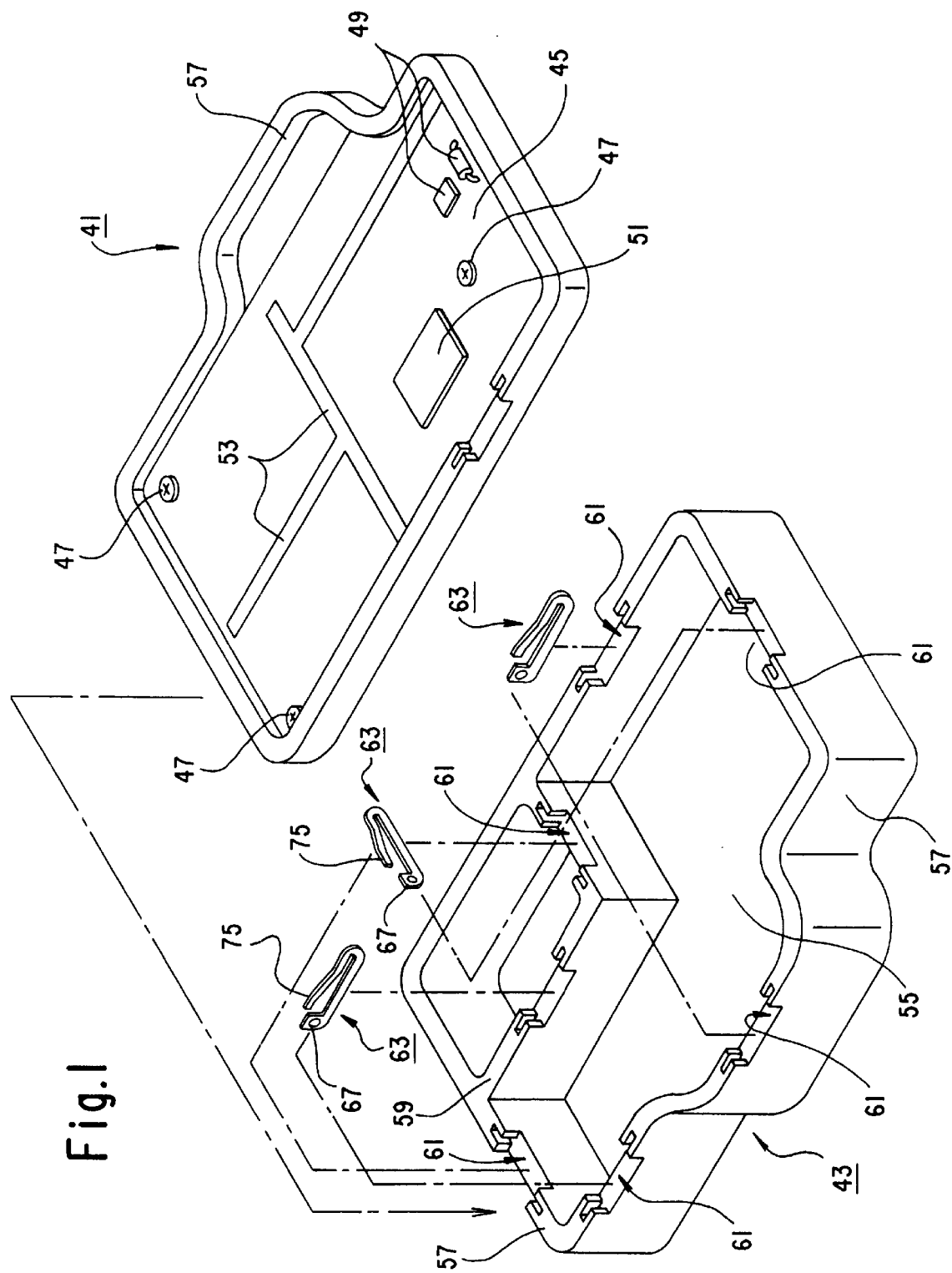
FIG. 1 is an exploded perspective view illustrating front and rear cases 41 and 43 and contact pieces 63 according to an embodiment of the present invention.
Figure 2:
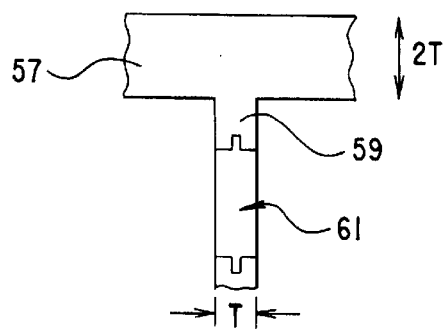
FIG. 2 is an enlarged plan view of the principal part in FIG. 1.

Referring first to FIGS. 1 through 9, an embodiment of the present invention will be described.

The structure of this embodiment is intended for use in a portable telephone. The telephone housing is made up of front and rear cases 41 and 43 that are assembled into a one-piece structure by an engagement mechanism, though not shown.

On the inside of the front case 41 there is placed and fixed thereto a printed-circuit board 45 by means of screws 47. The printed-circuit board 45 has a high-frequency oscillation circuit 61 mounted thereto together with many other electronic parts 49, though not shown. Formed around the high-frequency oscillation circuit 51 on the printed-circuit board 46 is a grounding (earthing) pattern 63 that will eventually perform the additional function of acting as a shield. Contact pieces 63, described later, are held in contact with the grounding pattern 53.

The front and rear cases 41 and 43 are each coated over the entire area of the interior surface thereof with a metal shield layer (not shown) formed, for example, by nickel plating or copper evaporation. The metal shield layer covers not only the surfaces of side walls 57 raised along the periphery of the rear case 41 but also the surfaces of partition walls 59 formed integrally with the peripheral side walls 57 and the interior surfaces of recesses 61 formed in the walls 57 and 69 to receive the contact pieces 63. Accordingly, the inside surfaces of the contact receiving recesses 61 and the inside surface of the rear case 43 are electrically connected through the metal shield layer deposited uniformly all over them.

Figure 3:
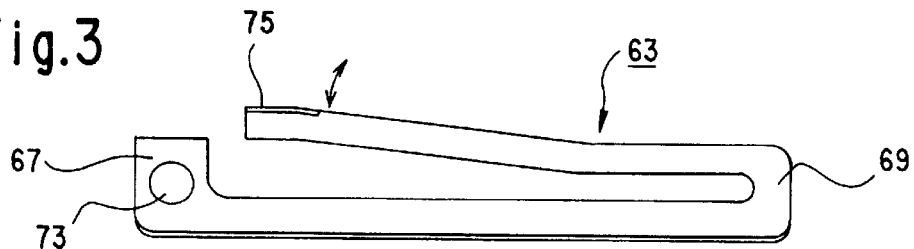
FIG. 3 is a front view of the contact piece 63.

As depicted in FIGS. 3 through 8, each contact receiving recess 61 formed in a rib (that forms the peripheral side walls 57 and the partition walls 59) has a pair of contact retaining grooves 65 cut therein at opposite ends of the recess 61 lengthwise thereof. One end portion 67 of the contact piece 63 of a substantially V-shape as shown in FIG. 3 is forced into the one contact retaining groove 65, and the other forked end portion 69 of the contact piece 63 is loosely engaged in the other contact retaining groove 65. The contact receiving recess 61 has a support portion 71 which is raised centrally from the recess floor lengthwise thereof to support the central portion of the contact piece 63 received in the recess 61.

Figure 4:
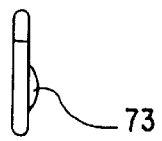
FIG. 4 is its side view.
Figure 5:
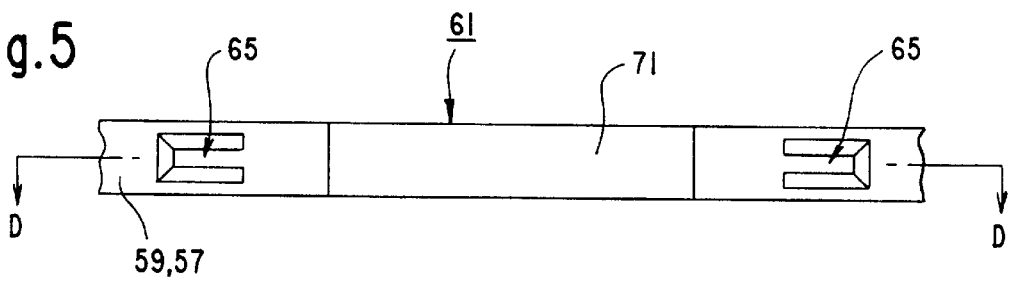
FIG. 5 is a plan view of a recess G1 for receiving the contact piece 63.
Figure 6:
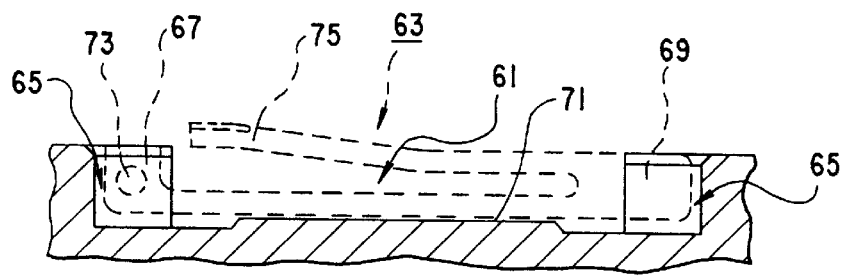
FIG. 6 is a sectional view taken along the line D—D in FIG. 5.

As depicted in FIGS. 3 and 4, the contact piece 63 is formed by stamping from a conductive resilient sheet as of phosphor bronze, and it has a thin, narrow, substantially V-shape as a whole. The one end portion 67 of the V-shaped contact piece 63 forms a wide engaging portion, which has a boss 73 formed by pressing. The thickness of the engaging portion 67 having the boss 73 is somewhat larger than the width of the one contact retaining groove 65 of the contact receiving recess 61. Hence, when it is forced into the groove 65, the engaging portion 67 of the contact piece 63 establishes electrical contact with the metal shield layer of the groove 65 at a high contact pressure, and the contact piece 63 is received snugly in the recess 61.

Since the contact piece 63 can be held in the recess 61 formed in each rib (57, 59) as described above, the depth D of the recess 61 (FIG. 7) could be made larger than the height of the rib (57, 59); that is, the recess 61 could be extended down into a thick portion 77 of the rear case 43. Accordingly, even if the height h of the rib (67, 59) is made small, the recess 61 can be made sufficiently deep. This ensures snug retention of the contact piece 63 in the recess 61 and, at the same time, permits reduction of the thickness of the rear case.

The forked end portion 69 of the contact piece 63 is loosely fitted in the other contact receiving groove 65 as referred to above. This groove 66 serves merely to hold the contact piece 63 in place when it is assembled to the rear case 43; the contact piece 63, though loosely engaged in the groove 66, will not come off therefrom after the rear and front cases 43 and 41 are assembled into a unitary structure.

The free end extending from the forked end portion 69 forms a contact portion 75, which is spaced away from the engaging portion 67 and hence has a resilient force such that it bends in a direction perpendicular to that in which the contact piece 63 was stamped from a sheet metal as of phosphor bronze (i.e. the direction parallel to the plane of the drawing in FIG. 3). The contact portion 75 makes resilient contact with the electromagnetic shield area on the front case 41 at a predetermined contact pressure.

As depicted in FIG. 9, a single thin sheet of a conductive, resilient material is blanked into a plurality of such contact pieces 63, which are linked at one end to a carrier 79 as shown. After the formation of the bosses 73 on them, the contact pieces 63 still connected to the carrier 79 are transported in a rolled form.

In the assembling of the telephone housing, the contact pieces 63 individually severed from the carrier 79 are each fitted in the contact receiving recess 61 of the rear case 43. In this instance, the bossed portion 73 of the contact piece 61 is pressed into the one contact receiving groove 65 of the recess 61 as mentioned previously.

After the contact pieces 63 are fitted in the contact receiving recesses 61, the front case 41 is assembled to the rear case 43. The contact portions 76 of the contact pieces 63 mounted on the partition walls 59 of the rear case 43 make resilient contact with the grounding pattern 53 on the printed-circuit board 45 which serves as the electromagnetic shielding area of the front case 41.

On the other hand, the contact portions 76 of the contact pieces 63 mounted on the peripheral side walls 67 of the rear case 43 make contact with top end portions of the peripheral side walls 57 of the front case 41. The top end portions of the peripheral side walls 57 of the front case 41 are also coated with the metal shield layer deposited all over the interior surface of the front case 41 as mentioned previously. Thus, the plurality of contact pieces 63 placed in the rear case 43 establish electric connections between the metal shield layers coated all over the interior surfaces of the front and rear cases 41 and 43, respectively, and the grounding pattern 53 on the printe-d-circuit board 45; accordingly, the metal shield layers are held equipotential to the grounding pattern 53.

Consequently, the high-frequency oscillation circuit 61 is surrounded by the grounding pattern 63 and the metal shield layers equipotential thereto. That is, an electromagnetic shield structure is provided which prevents leakage therethrough of electromagnetic waves.

The electromagnetic shield structure according to this embodiments achieves such effects as listed below.

Figure 12:
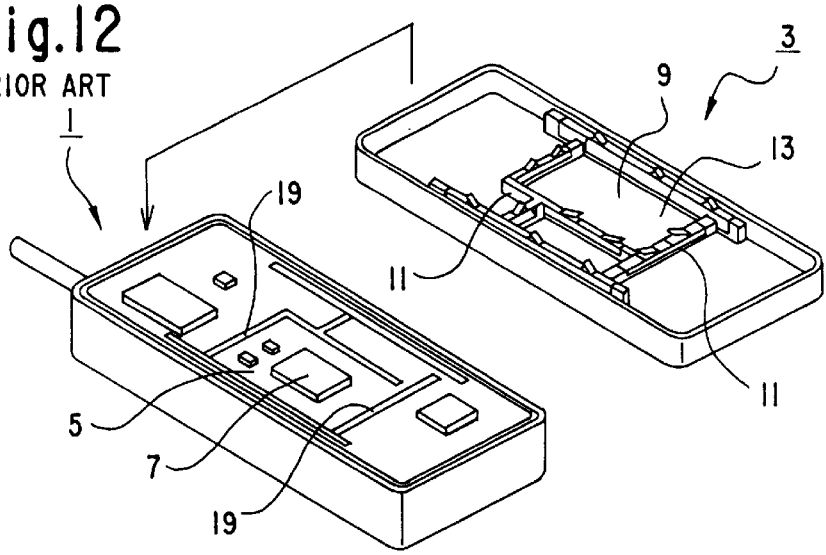
FIG. 12 is an exploded perspective view of an electronic equipment housing of a prior art example.
Figure 13:
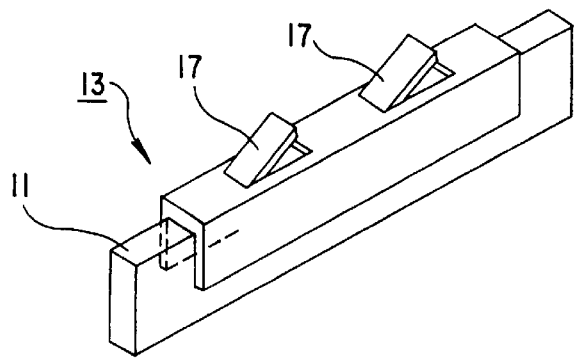
FIG. 13 is an enlarged perspective view showing a contact piece 13 in FIG. 12.
Figure 14:
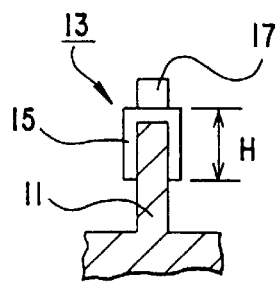
FIG. 14 is a sectional view of FIG. 13.

(1) Even if the heights of the ribs 59 and 67 are not so large, the depth D of each contact receiving recess 61 can be made large corresponding to the thickness of the rear case 43 as depicted in FIG. 7—this permits of a firm retention of the contact piece 63. Hence, the ribs 59 and 67 can be made lower than in the prior art example (shown in FIGS. 12 to 14) in which the inverted U-shaped contact piece 13 is mounted in straddle fashion on the rib 11 with the gripping portion 16 held in gripping engagement with the top thereof. Accordingly, this embodiment permits implementation of a low-profile electronic equipment.

(2) The fabrication of the contact pieces 13 and 21 in the prior art examples FIGS. 12 to 14 and FIG. 16) involves bending of blanks at right angles or obliquely to their surfaces. To meet a growing demand for miniaturized electronic equipment in recent years, such contact pieces need to be as short as several millimeters; accurate bending of such small contact pieces requires much skill and a highly developed or sophisticated bending machine. In the prior art example of FIGS. 12 to 14, particularly accurate bending is required since no firm retention force could be provided without accurate gripping engagement of the inverted U-shaped gripping portion 15 with the top of the rib. According to this embodiment however, the contact piece 63 can be fabricated without involving such cumbersome bending work and can be made resilient simply by stamping it from a sheet metal. In short, the contact piece 63 can be produced without any difficulty.

Figure 15:
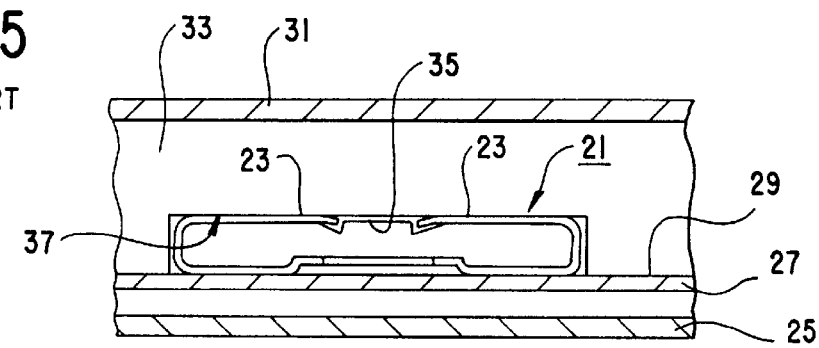
FIG. 15 is a sectional view showing another prior art example.

(3) According to this embodiment, the grounding pattern 53 need not be made wide in advance unlike in the FIG. 15 prior art example in which the contact piece 21 is soldered to the grounding pattern 29 on the printed-circuit board 27. This allows the use of a printed-circuit board with narrow patterns, and hence permits enhancement of the packaging density of the electronic parts 49 on the printed-circuit board 45.

(4) In a housing formed by injection molding of a synthetic resin material, it is necessary that, letting the thickness of the peripheral side wall 67 be represented by 2T, the partition wall 59 perpendicular thereto be designed to have a thickness smaller than T so as to accomplish a uniform flow of fused resin throughout a die. An increase in the thickness 2T of the peripheral side wall 67 will not only require an additional amount of molding material but also cause sinking (a phenomenon that an increased thickness of resin introduces nonuniformity in the temperature distribution at the time of molding, resulting in the resin surface becoming uneven). For this reason, the thickness of the wall 57 cannot be made large; accordingly, the thickness T of the partition wall 69 is made inevitably small.

According to this embodiment, however, since the engaging portion 67 of the contact piece 63 is held upright in the contact retaining groove 65 formed in the partition wall 69, the width W of the groove 65 (FIG. 8) needs only to be equal to the thickness of the engaging portion 67. Accordingly, the partition wall 69 need not be thick. This permits reduction of the thickness of the peripheral side walls 57 perpendicular to the partition walls 59 and hence precludes the possibility of sinking in their wall surfaces. Further, since the ribs 59 and 57 can be made thin, the amount of resin for molding the housing can be reduced as a whole, allowing weight reduction and cost cutting of the housing.

While the above embodiment has been described to use the substantially V-shaped contact piece 63, the invention is not limited specifically thereto but may use contact pieces of various other configurations.

Figure 10:
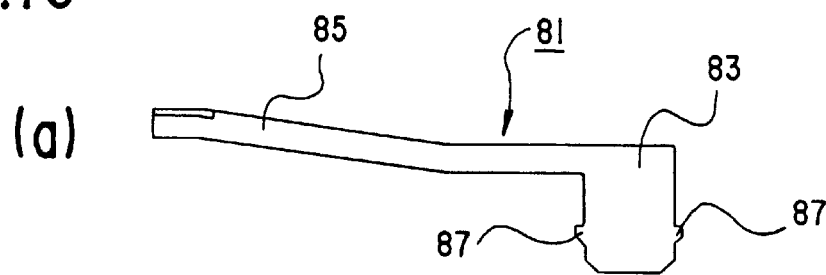
FIG. 10(a) is a front view of a contact piece 81 in another embodiment of the present invention.
FIG. 10(b) is a sectional view depicting how the contact piece 81 is received in a contact receiving recess.
Figure 10:
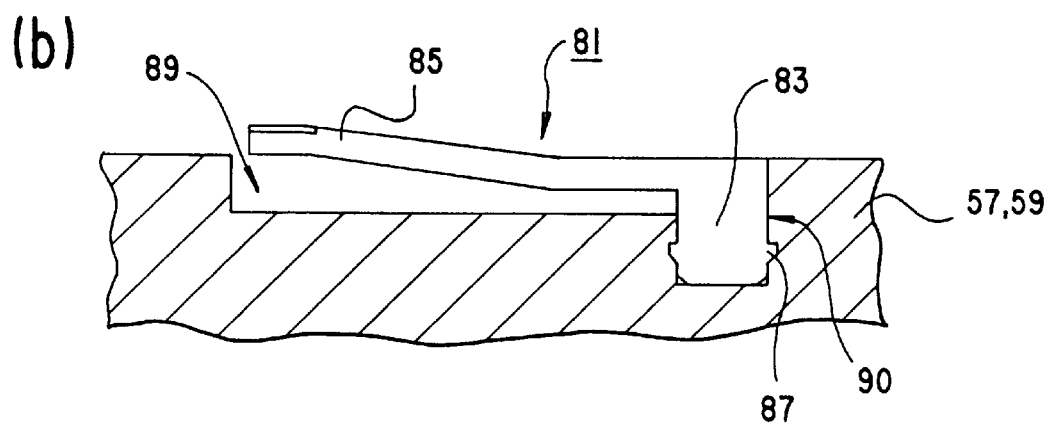

FIG. 10 illustrates a contact piece 81 which is L-shaped in its entirety and is composed of a rectangular engaging portion 83 and a rod-like contact portion 85 extending therefrom obliquely upward. The engaging portion 83 has on its both sides a pair of locking projections 87. FIG. 10(*b*) shows how the contact piece 81 is held in a contact receiving recess 89; the engaging portion 83 is press-fitted in a contact retaining groove 90 and locked therein with the locking projections 87 biting into the inner wall surfaces of the groove 90. Since it is firmly locked to the retaining groove 90, the engaging portion 83 is fixedly secured thereto with no play and holds the contact portion 86 in a cantilever fashion and hence imparts thereto resiliency. At the same time, the engaging portion 83 is held in contact with a metal shield layer deposited all over the interior surface of the retaining groove 90, establishing electric connections between the wall (57, 59) and the contact piece 81.

Figure 11:
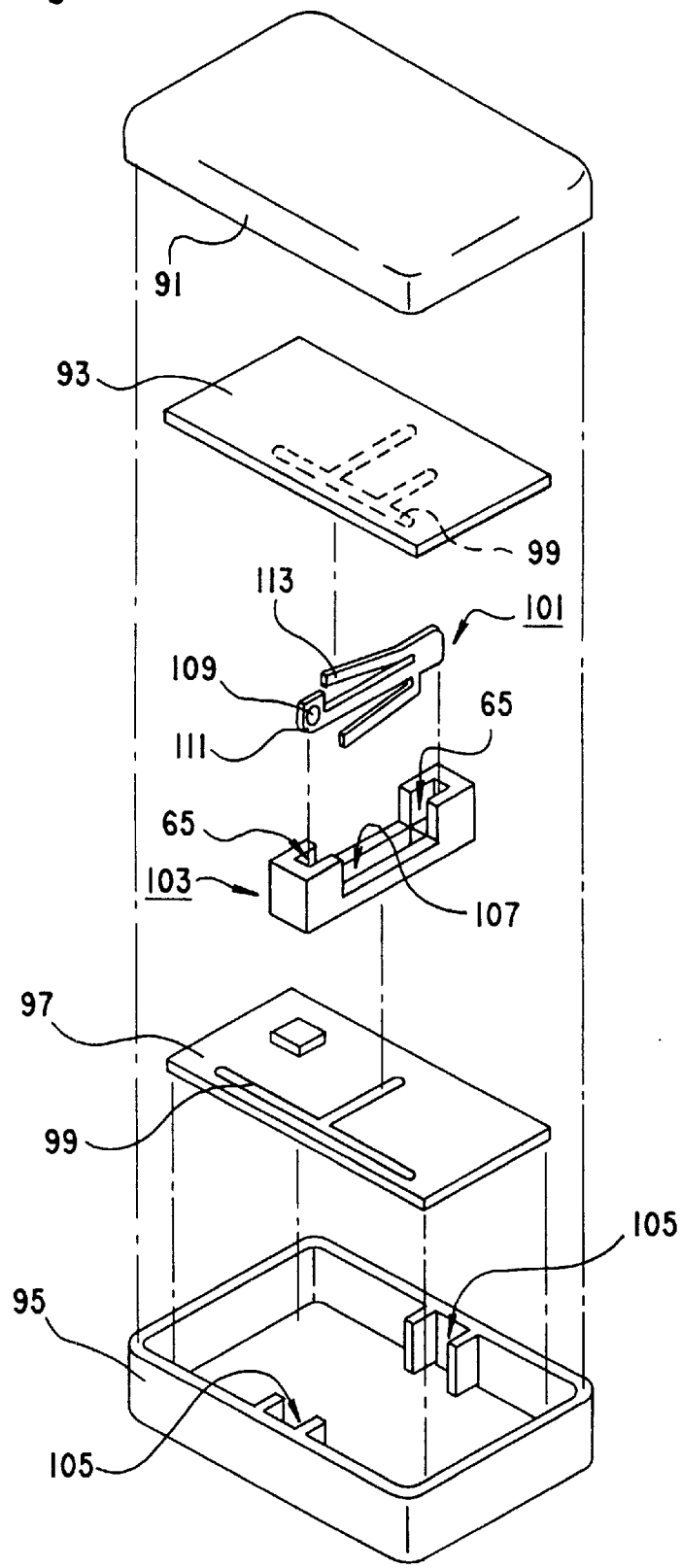
FIG. 11 is an exploded perspective view of electronic equipment illustrating still another embodiment of the present invention.

Although in the above the contact piece 63 or 81 has been described to have only at one side the contact portion 75 or 85, it is also possible to provide such contact portions at both sides of the contact piece as depicted in FIG. 11.

In the FIG. 11 embodiment there are provided a printed-circuit board 93 in a front case 91 and a printed-circuit board 97 in a rear case 95. The printed-circuit boards 93 and 97 have formed thereon grounding patterns 99 that will serve sa shielding areas. The grounding patterns 99 are electrically connected by a single contact piece 101.

Interposed between the printed-circuit boards 93 and 97 is a contact piece support block 103 used as a substitute for the partition wall 69 in the embodiment described above. The contact piece support block 103 is provided separately of the housing and is fixed thereto by having its both ends engaged with grooves 105 formed in the front and rear cases 91 and 96 when they are assembled to each other. The contact support block 103 has a longitudinal slot formed centrally thereof for receiving the contact piece 101. The contact piece receiving slot 103 extends from the top of the block 103 down to the underside thereof. As is the case with the contact receiving recess 61 in the embodiment described previously with reference to FIGS. 1 through 8, the contact piece support block 103 has at its both ends contact retaining grooves 65.

The contact piece 101 has an engaging portion 111 with a boss 109 thereon as in the above-described embodiment, And the contact piece 101 has contact portions 113 cantilevered radially from its base end portion substantially in symmetric relation to each other in the vertical direction.

In this embodiment too, the front and rear cases 91 and 93 are each coated all over the interior surface with a metal shield layer. The contact piece support block 103, including the contact receiving slot 107, is also coated all over its surface with a metal shield layer.

Accordingly, when the contact piece support block 103 is engaged at both ends to the grooves 106, the metal shield layers deposited all over the inside surfaces of the front and rear cases 91 and 95 are brought into contact with the metal shield layer deposited all over the inside surface of the contact retaining groove 107, establishing electric connections between them.

That is, according to this embodiment, the metal shield layer coated all over the interior surface of the contact receiving slot 107 and the metal shield layer coated all over the interior surface of each case need not always be continued as in the above embodiments; but instead the metal shield layers may be electrically connected when they make contact with each other as in this embodiment.

When the front and the rear cases 91 and 95 are assembled into a one-piece structure, the metal shield layers on their inside surfaces are electrically connected to the grounding patterns 99 of the both printed-circuit boards 93 and 97, electromagnetically shielding the space defined by the both cases.

In this embodiment, too, the resilient contact piece 101 is obtained simply by stamping it from a sheet metal and hence does not involve any cumbersome machining. Further, since it is fitted in the contact receiving slot 107 of the contact piece support block 103, the contact piece 101 is not soldered to the grounding pattern 29 on the printed-circuit board 27 as in the prior art (FIG. 15). Hence, the use of the contact piece 101 achieves a high packaging density of electronic parts on the printed-circuit boards 93 and 97.

EFFECT OF THE INVENTION

The present invention described above produces such effects as mentioned below.

(1) Since the formation of very small contact pieces does not involve bending, the machining process is simplified and no high-precision machines are required.

(2) The contact piece as stamped from a sheet metal is contacted with the shielding area; for example, when the shielding area is the grounding pattern on the printed-circuit board, the pattern can be made narrow—this increases the packaging density of the printed-circuit board.

(3) Since the contact piece is not soldered to the grounding pattern on the printed-circuit board, its packaging density can be increased.

It will be apparent that many modifications and variations may be effected without departing from the scope of the novel concepts of the present invention.

What is claimed is:

1. An electromagnetic shielding structure for electronic equipment having a high-frequency oscillation circuit placed in its horsing made up of front and rear cases with shielding areas provided on their inside surfaces in a manner to surround said high-frequency oscillation circuit, said shielding areas being electrically connected to provide electromagnetic shielding for preventing leakage of electromagnetism to the outside from said high-frequency oscillation circuit, said electromagnetic shielding structure comprising:

ribs forming peripheral side walls or partition walls of said front case or rear case, each of said ribs having a contact receiving recess extending down from the top thereof;

metal shielding layers coated all over the interior surfaces of said contact receiving recess and said front case or rear case to establish electrical connections between them; and a plurality of said contact pieces stamped from a conductive sheet metal, each said contact piece having an engaging portion and a contact portion formed integrally therewith, said engaging portion being press-fitted in and fixed to said contact receiving recess formed in each of said ribs without soldering, said contact portion being formed and held in the same plane as that of said engaging portion and resilient in the direction perpendicular to that in which said contact piece was stamped from said conductive sheet metal, said contact portion making resilient contact with said shielding area of said rear case or front case.

2. The electromagnetic shielding structure according to claim 1, wherein said shielding area, with said contact portion of said contact piece making resilient contact, is a grounding pattern printed on a printed-circuit board placed in said rear case or said front case.

* * * * *